(12) United States Patent
Morimoto et al.

(10) Patent No.: US 6,707,369 B2
(45) Date of Patent: Mar. 16, 2004

(54) POWER DISTRIBUTING BOX AND POWER-DEVICE MODULE

(75) Inventors: Mitsuaki Morimoto, Shizuoka-Ken (JP); Yoshinori Ikuta, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/273,289

(22) Filed: Oct. 18, 2002

(65) Prior Publication Data

US 2003/0090358 A1 May 15, 2003

(30) Foreign Application Priority Data

Nov. 14, 2001 (JP) ........................... P2001-349283
Feb. 14, 2002 (JP) ........................... P2002-037297

(51) Int. Cl.[7] .................. H01H 85/175; H01H 85/20; H02B 1/18
(52) U.S. Cl. .................. 337/189; 337/256; 337/268; 361/642; 361/626; 361/833
(58) Field of Search ................... 337/158, 180, 337/186–189, 227, 269, 283; 361/104, 626, 646, 833, 837; 439/250, 366, 621, 622, 830, 890, 893

(56) References Cited

U.S. PATENT DOCUMENTS

| 5,179,503 | A | * | 1/1993 | Fouts et al. ............... 361/729 |
| 5,643,693 | A | * | 7/1997 | Hill et al. ................. 429/121 |
| 5,777,843 | A | * | 7/1998 | Younce ...................... 361/641 |
| 5,928,004 | A | * | 7/1999 | Sumida et al. ............ 439/776.2 |
| 5,995,380 | A | * | 11/1999 | Maue et al. ............... 361/826 |
| 6,000,952 | A | * | 12/1999 | Gladd et al. .............. 439/76.2 |
| 6,350,949 | B1 | * | 2/2002 | Boyd ....................... 174/50.5 |
| 6,354,868 | B1 | * | 3/2002 | Korczynski et al. ........ 439/516 |
| 6,402,530 | B1 | * | 6/2002 | Saito et al. ............... 439/76.2 |
| 6,402,569 | B1 | * | 6/2002 | Spadoni et al. ............ 439/723 |
| 6,494,723 | B2 | * | 12/2002 | Yamane et al. ............ 439/76.2 |

* cited by examiner

Primary Examiner—Anatoly Vortman
(74) Attorney, Agent, or Firm—Finnegan, Henderson, Farabow, Garrett & Dunner, L.L.P.

(57) ABSTRACT

In a casing (2), there are accommodated a power-source side bus-bar (5) connected to a power source, a plurality of load side bus-bars (7) having respective terminals connected to respective electrical loads, a plurality of power devices (8) interposed between the power-source side bus-bar (5) and the load side bus-bars (7) to control power supply for the electrical loads; and a circuit base plate (9) having a built-in driver circuit for transmitting control signals to the power devices (8). In the form of bare tips, the power devices (8) are arranged on and connected to the load side bus-bars (7) respectively. The power devices (8) are connected to the circuit baseplate (9) through wire bondings (11). The power devices (8) are also connected to the power-source side bus-bar (5) through wire bondings (12). Each load side bus-bar (7) has a tuning-fork type terminal (6) allowing an insertion of a plate-shaped terminal (50a) of a fuse (50).

8 Claims, 11 Drawing Sheets

POWER DISTRIBUTING BOX AND POWER-DEVICE MODULE

BACKGROUND OF THE INVENTION

1. Field of the Invention

The present invention relates to a power distributing box for an automobile and a power-device module which is useful for the power distributing box.

2. Description of Related Art

Generally, an automotive power distributing box has a casing, a bus-bar connected to a power source (battery), a plurality of bus-bars having respective terminals connected to respective loads, a plurality of power devices interposed between the bus-bar on the side of the power source and the bus-bars on the side of the loads to control the power supply to the loads and a circuit baseplate having a built-in driver circuit for transmitting control signals to the power devices.

In the prior art power distributing box, it is general that package components are employed for the power devices. The package components are installed on the circuit baseplate. Respective terminals of the power devices are soldered to circuit conductors on the circuit baseplate. Further, the bus-bars are connected to respective terminals of the power devices and the circuit baseplate by connecting means, for example, connectors, jumpers, etc.

In this way, the conventional power distributing box is required to employ the above connecting means, such as connector and jumpers, for connecting the terminals of the power devices and the circuit baseplate with the bus-bars. Consequently, a number of components are required for the conventional power distributing box, causing its manufacturing cost and a space necessary for the box to be increased.

SUMMARY OF THE INVENTION

Under such a situation, it is therefore an object of the present invention to provide a power distributing box which enables reduction of both manufacturing cost and space due to the reduced number of components, and also provide a power-device module for realizing such a power distributing box.

The above-mentioned object can be solved by providing a power distributing box electrically interposed between a power source and respective electrical loads, the power distributing box comprising:

a casing;

a power-source side bus-bar accommodated in the casing and connected to the power source;

a plurality of load side bus-bars accommodated in the casing, the load side bus-bars having respective terminals connected to the electrical loads respectively;

a plurality of power devices accommodated in the casing and respectively interposed between the power-source side bus-bar and the load side bus-bars to control power supply for the electrical loads; and a circuit baseplate accommodated in the casing to have a built-in driver circuit for transmitting control signals to the power devices;

wherein the power devices in the form of bare tips are arranged on and connected to either one of the power-source side bus-bar and the load side bus-bars; and the power devices are connected to the circuit baseplate and the other one of the power-source side bus-bar and the load side bus-bars, through wire bondings.

According to the power distributing box constructed above, the power devices in the form of bare tips are arranged on and connected to either one of the power-source side bus-bar and the load side bus-bars. Further, the connection between the power devices and the circuit baseplate and the connection between the power devices and the other one of the power-source side bus-bar and the load side bus-bars are accomplished by the wire bondings. Therefore, there is no need to use means for connecting the elements with each other (e.g. connectors, jumper lines, etc.). That is, since the above-mentioned structure is different from the conventional structure where the circuit baseplate is equipped with package components, it is possible to reduce the number of components.

Further, owing to the arrangement where the bus-bars (i.e. the power-source side bus-bar or the load side bus-bars) are respectively equipped with the power devices in the form of bare tips, there is no need to secure the installation space of the power devices on the circuit baseplate and also no need to spread power lines on the circuit baseplate. Therefore, due to the miniaturization of the circuit baseplate, it is possible to reduce the size of a space occupied by the power distributing box.

As the second aspect of the invention, each of the terminals of the load side bus-bars is shaped so as to be a tuning fork having a slit allowing an insertion of a plate-shaped terminal of a fuse.

Owing to the above formation of the terminal, it becomes possible to fit a terminal of a fuse to the tuning-fork type terminal directly.

As the third aspect of the invention, an installation area of the power devices and a connecting area of the wire bondings are covered with a resinous mold. Consequently, it is possible to provide the power distributing box resistant to an external shock.

As the fourth aspect of the invention, the power distributing box of the first aspect further comprises a radiator plate for mounting the power-source side bus-bar and the load side bus-bars thereon, wherein the radiator plate having the power-source side bus-bar and the load side bus-bars thereon is accommodated in the casing.

In this case, since the radiator plate mounting the power-source side bus-bar and the load side bus-bars thereon is accommodated in the casing, it becomes possible to assemble the power distributing box with ease and also possible to enhance the heat-radiation from the power devices.

As the fifth aspect of the invention, there is also provided a power device module to be electrically interposed between a power source and respective electrical loads, the power device module comprising:

a power-source side bus-bar connected to the power source;

a plurality of load side bus-bars having respective terminals connected to the electrical loads respectively;

a plurality of power devices respectively interposed between the power-source side bus-bar and the load side bus-bars to control power supply for the electrical loads;

a plurality of connecting terminals connected to the power devices, for transmitting control signals to the power devices; and a resinous mold for covering the power-source side bus-bar, the load side bus-bars, the power devices and the connecting terminals, in integration; wherein the power devices in the form of bare tips are arranged on and connected to either one of the power-source side bus-bar and the load side bus-bars; and the power devices are connected to the connecting terminals and the other one of the power-source side bus-bar and the load side bus-bars, through wire bondings.

According to the above-mentioned structure of the power device module, if only mounting this power device module on a circuit baseplate as a constituent of the power distributing box and further connecting the connecting terminals with circuit conductors on the circuit baseplate, then it becomes possible to finish the power distributing box with ease.

Accordingly, since it is unnecessary to prepare connecting means (e.g. connectors, jumper wires) in order to establish the connection between the circuit board and the power devices and also the connection between these bus-bars (i.e. the power-source side bus-bar, the load side bus-bars) and the circuit board, it is possible to reduce the number of components forming the power distributing box. Additionally, as these bus-bars and the power devices both indispensable to the power distributing box are installed in the power device module, there is no need to provide superfluous bus-bars besides the module 60 and additionally, power lines wired in the circuit baseplate are eliminated. Therefore, it is possible to reduce an occupation space necessary for the installation of components. Since the plural power devices are in the form of bare tips and the individual power device and the corresponding load side bus-bar are gathered just like a single component, it is possible to reduce a space occupied by the components in comparison with a case that discrete components of the same number are arranged.

As the sixth aspect of the invention, in the power device module, the load side bus-bars are arranged on one side of the power-source side bus-bar at intervals of a first pitch each. The connecting terminals are arranged on the other side of the power-source side bus-bar at intervals of a second pitch each, the second pitch being smaller than the first pitch thereby defining at least one free space at the end of the array of the connecting terminals. The power device module has an attaching part established in the free space, for attachment of the power device module.

Therefore, by putting the free space in effective use, it is possible to provide the small-sized power device module.

As the seventh aspect of the invention, in the power device module, the load side bus-bars are arranged on one side of the power-source side bus-bar at intervals of a first pitch each. The power device in the form of bare tips are arranged on the power-source side bus-bar at intervals of a third pitch each, the third pitch being smaller than the first pitch thereby defining at least one free space at the end of the array of the power devices. The power device module has a connecting part established in the free space, for external connection of the power-source side bus-bar.

Also, by putting the free space in effective use, it is possible to provide the small-sized power device module.

As the eighth aspect of the invention, in the power device module, each of the terminals of the load side bus-bars is shaped so as to be a tuning fork having a slit allowing an insertion of a plate-shaped terminal of a fuse.

Also in the power device module, owing to the above formation of the terminal, it becomes possible to fit a terminal of a fuse to the "tuning-fork" type terminal directly.

These and other objects and features of the present invention will become more fully apparent from the following description and appended claims taken in conjunction with the accompany drawing.

BRIEF DESCRIPTION OF THE DRAWINGS

FIGS. 4A and 4B are perspective views of a power-device module in accordance with an embodiment of the present invention, in which FIG. 4A shows the power-device module before it is covered with resinous mold and FIG. 4B shows the power-device module covered with resinous mold;

DESCRIPTION OF THE PREFERRED EMBODIMENT

An embodiment of the present invention will be described with reference to drawings.

Figure 1:
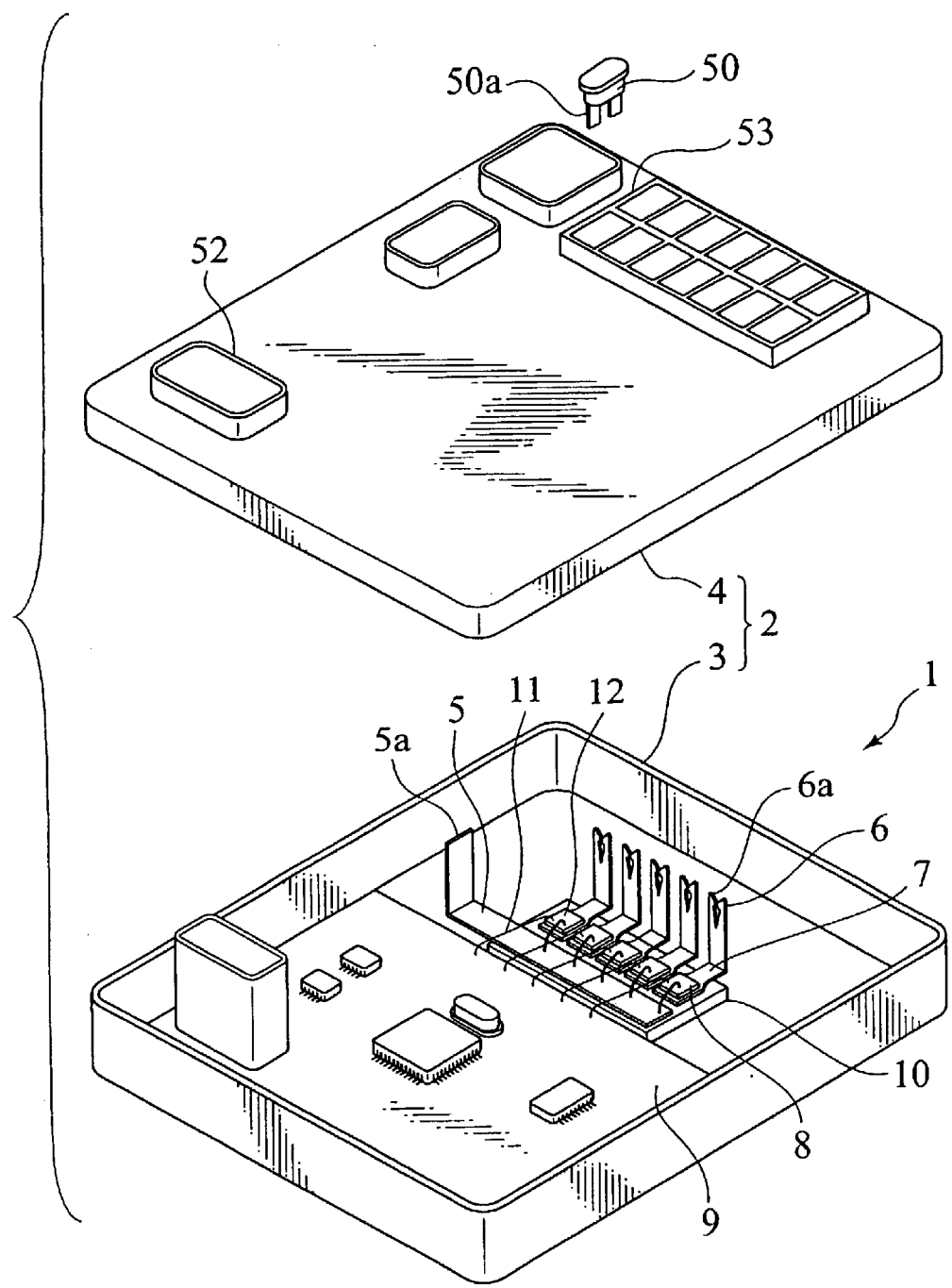
FIG. 1 is a perspective view of a power distributing box in accordance with an embodiment of the present invention.
Figure 2:
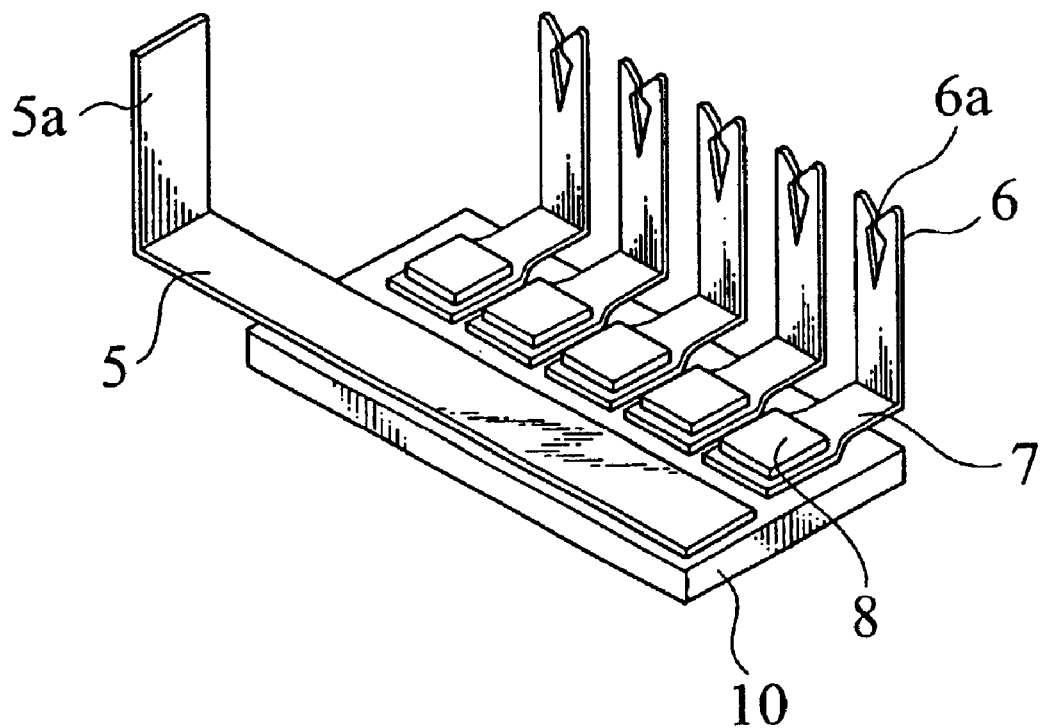
FIG. 2 is a perspective view of an assembly accommodated in the power distributing box of the embodiment, showing a condition where power devices are fitted to bus-bars.

FIG. 1 shows a power distributing box in the embodiment. FIG. 2 is an enlarged perspective view of power devices accommodated in the power distributing box.

This power distributing box 1 comprises a casing 2 having a rectangular box-shaped casing body 3 and a cover 4 for covering an upper opening of the casing body 3. Inside the casing body 3, there are a power-source side bus-bar 5 connected to a not-shown power source, a plurality of load side bus-bars 7 each provided, on its end, with a terminal 6 connected to an electrical load and shaped to be a tuning fork, a plurality of power devices 8 each interposed between the bus-bar 5 and the bus-bar 7 to perform power-supply control, and a circuit baseplate 9 having a built-in driver circuit for transmitting control signals to the power devices 8.

The cover 4 is provided with housings 52, 53 for receiving various kinds of connectors, a fuse 50 and so on. In each load side bus-bar 7, the terminal 6 in the form of a tuning fork includes a slit 6a into which a plate-shaped terminal 50a of the fuse 50 is inserted. By bending the bus-bar 7 in L-shaped pattern, the terminal 6 is formed to project upward. In assembly, the plate-shaped terminal 50a of the fuse 50 is inserted into the terminal 6 through the cover 4. Also in the power-source side bus-bar 5, it is bent to L-shaped configuration, providing a terminal 5a projecting upward.

The power-source side bus-bar 5 and the load side bus-bars 7 are secured on a radiator plate 10 of insulating material having high heat-conductivity at a designated position and further accommodated in the casing body 3. The power devices 8 in the form of bare tips are respectively mounted on respective upper faces of the other ends of the load side bus-bars 7. Each of the power devices 8 has a load side electrode (not shown) bonded to the corresponding bus-bar 7 directly. The connection between the power devices 8 and the circuit baseplate 9 and the connection between the power devices 8 and the power-source side bus-bar 5 are accomplished by means of wire bondings 11, 12, respectively.

Preferably, the installation area of the power devices 8 and the connecting area of the wire bondings 11, 12 are covered with resinous mold (not shown).

With the above-mentioned structure of the power distributing box 1, that is, since the power devices 8 in the form of bare tips are mounted on the bus-bars 7 and the connection between the power devices 8 and the circuit baseplate 9 and the connection between the power devices 8 and the power-source side bus-bar 5 are accomplished by the wire bondings 11, 12, there is no need to use means for connecting the elements with each other (e.g. connectors, jumper lines, etc.). That is, since the above-mentioned structure is different from the conventional structure where the circuit baseplate is equipped with package components, it is possible to reduce the number of components.

Further, owing to the arrangement where the load side bus bars 7 are respectively equipped with the power devices 8 in the form of bare tips, there is no need to secure the installation space of the power devices on the circuit baseplate 9 and also no need to spread power lines on the circuit baseplate 9. Therefore, due to the miniaturization of the circuit baseplate 9, it is possible to reduce the size of a space occupied by the power distributing box 1.

Since each load side bus-bar 7 is provided, on its end, with the terminal 6 in the form of a tuning fork, it is possible to carry out the connection with the electrical loads with ease if only fitting the fuse 50 into the terminal 6 through the plate-shaped terminal 50a, whereby the connecting work can be simplified. When the installation area of the power devices 8 and the connecting area of the wire bondings 11, 12 are covered with resinous mold, the reliability of a finished circuit can be enhanced. Additionally, since the power-source side bus-bar 5 and the load side bus-bars 7 are accommodated in the casing body 3 while they are arranged on the radiator plate 10, the assembling of these components can be performed with ease and the heat radiation of the power devices 8 can be enhanced.

In the above-mentioned embodiment, the power devices 8 in the form of bare tips are mounted on the load side bus-bars 7 respectively. Depending on the structure of the bare tips, the power devices 8 may be mounted on the power-source side bus-bar 5 in the modification.

In the modification, the radiator plate 10 may be formed by a metal plate. Then, the power-source side bus-bar 5 and the load side bus-bars 7 are adhesively fixed on the radiator plate 10 through the intermediary of an insulation sheet (not shown).

Figure 3:
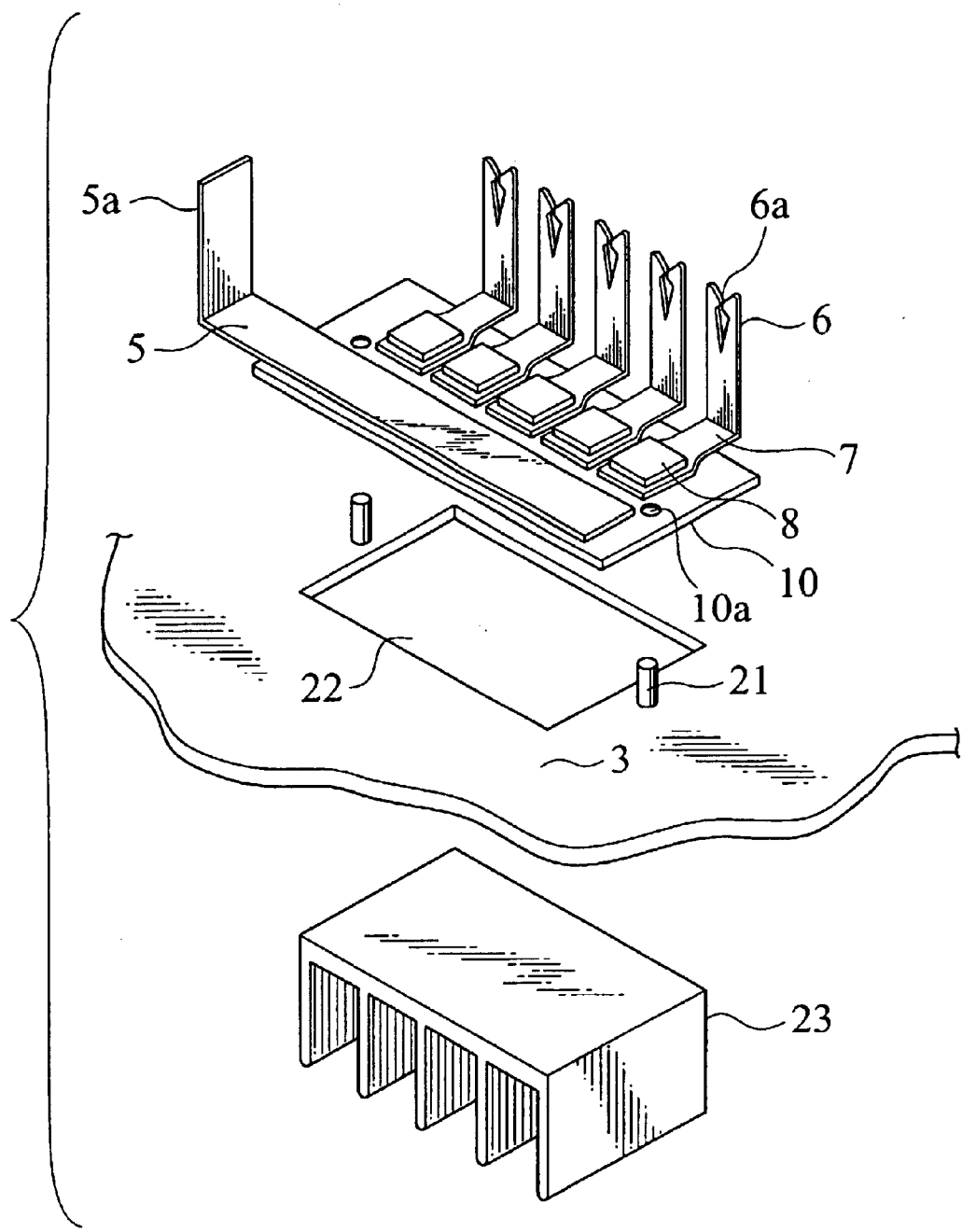
FIG. 3 is a perspective view of an essential part of the assembly, showing one modification of the power distributing box of the embodiment.

Additionally, as shown in FIG. 3, the radiator plate 10 may be provided with positioning holes 10a on the assumption that the casing body 3 has projections 21 formed on the bottom face. Then, the positioning of the bus-bars 5, 7 in relation to the casing body 3 can be attained by engaging the projections 21 of the casing body 3 in the-positioning holes 10a of the radiator plate 10. After positioning the radiator plate 10, the installation of the bus-bars 5, 7 is completed since the plate 10 is fixed on the casing body 3 by appropriate means, for example, glue, screws, rivets, etc.

Moreover, the casing body 3 may be provided, on its bottom, with an opening 22. In such a case, when a radiator unit 23 with fins is closely fitted on the bottom of the radiator plate 10 through the opening 22, the heat radiation of the assembly can be further improved.

Next, we describe an embodiment of the power-device module which is useful to make up the power distributing box.

Figure 4A:
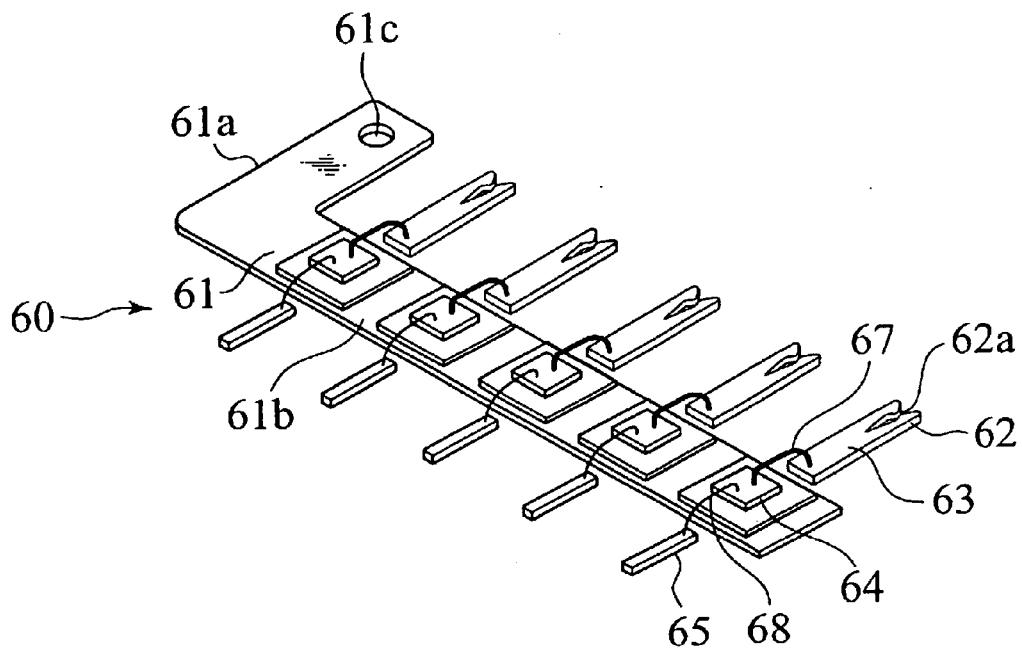
Figure 4B:
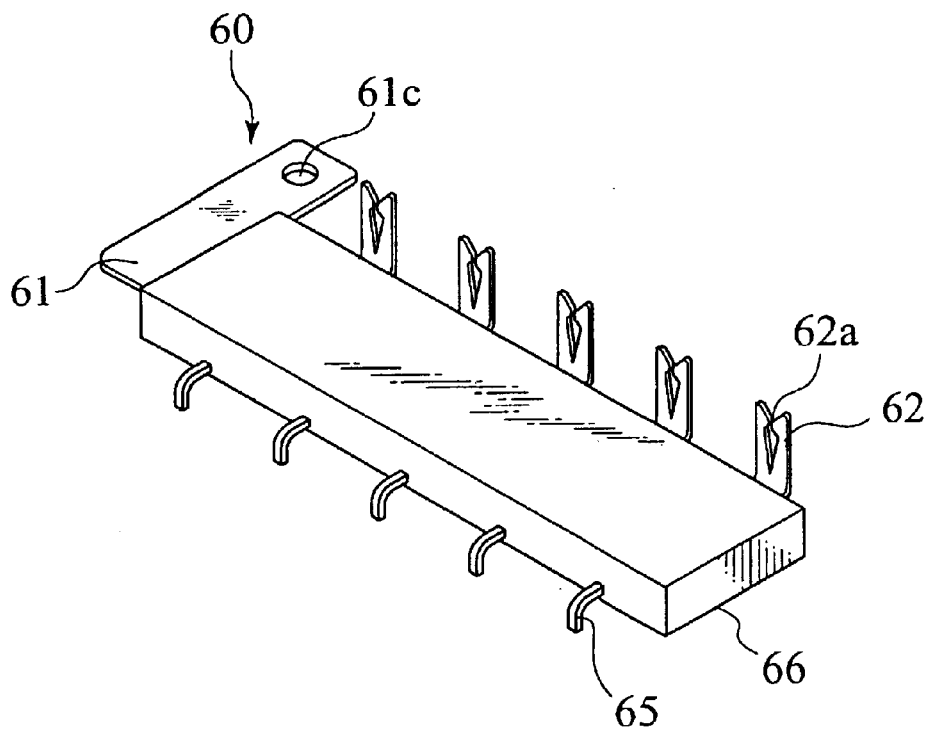
Figure 5:
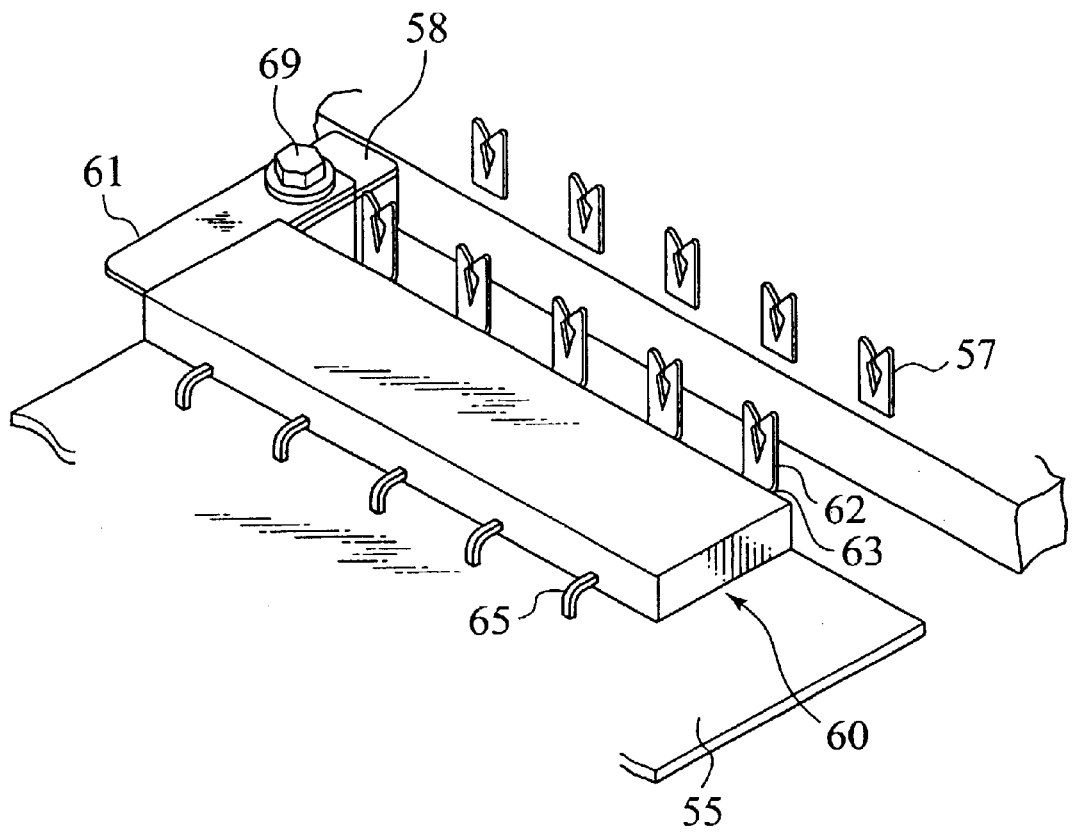
FIG. 5 is a perspective view of the power-device module of FIG. 4B, showing a condition that it is installed in the power distributing box.
Figure 6:
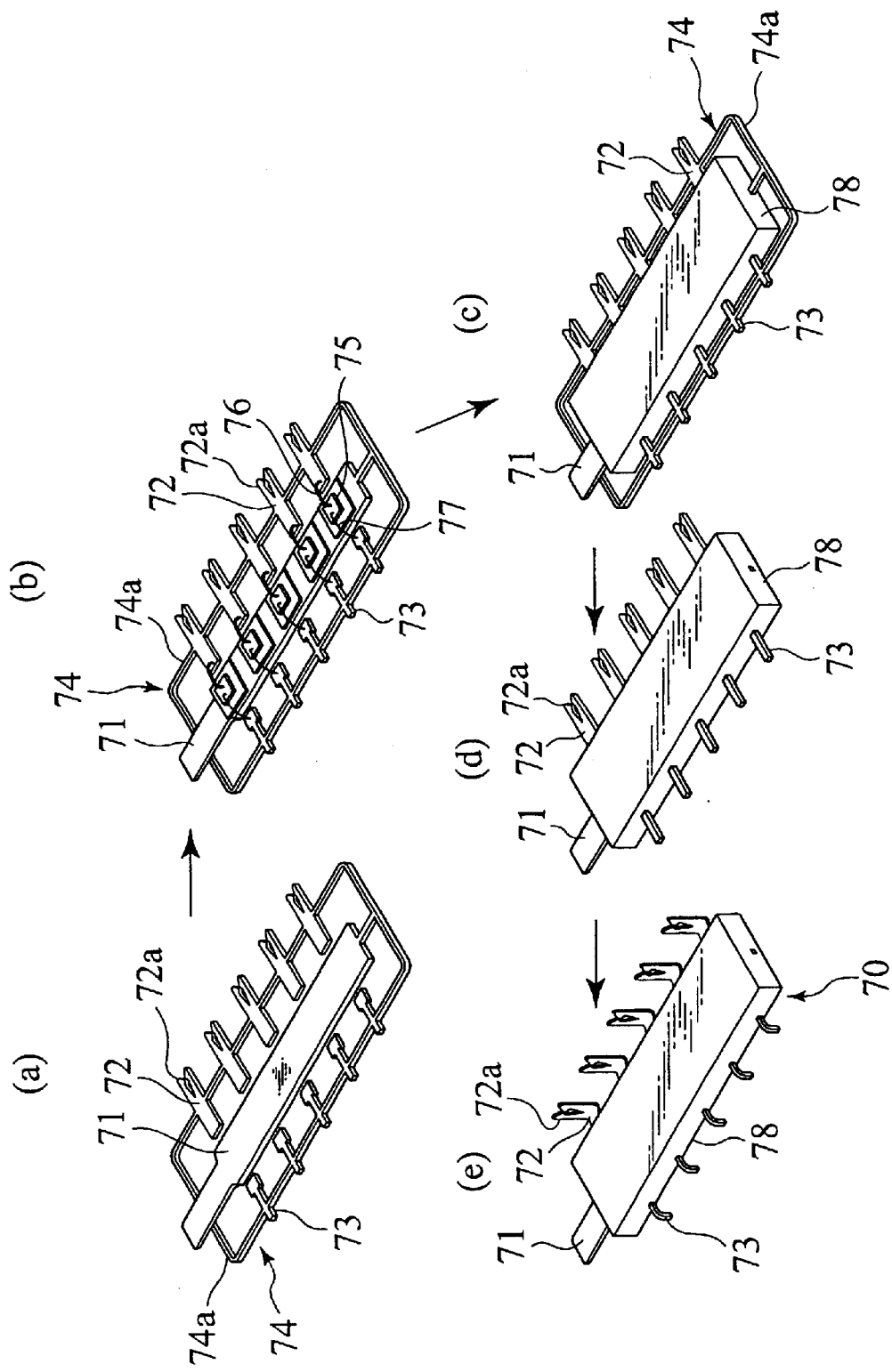
FIG. 6 is a process diagram showing the first example of the manufacturing order of the power-device module (a)–(e)
Figure 7:
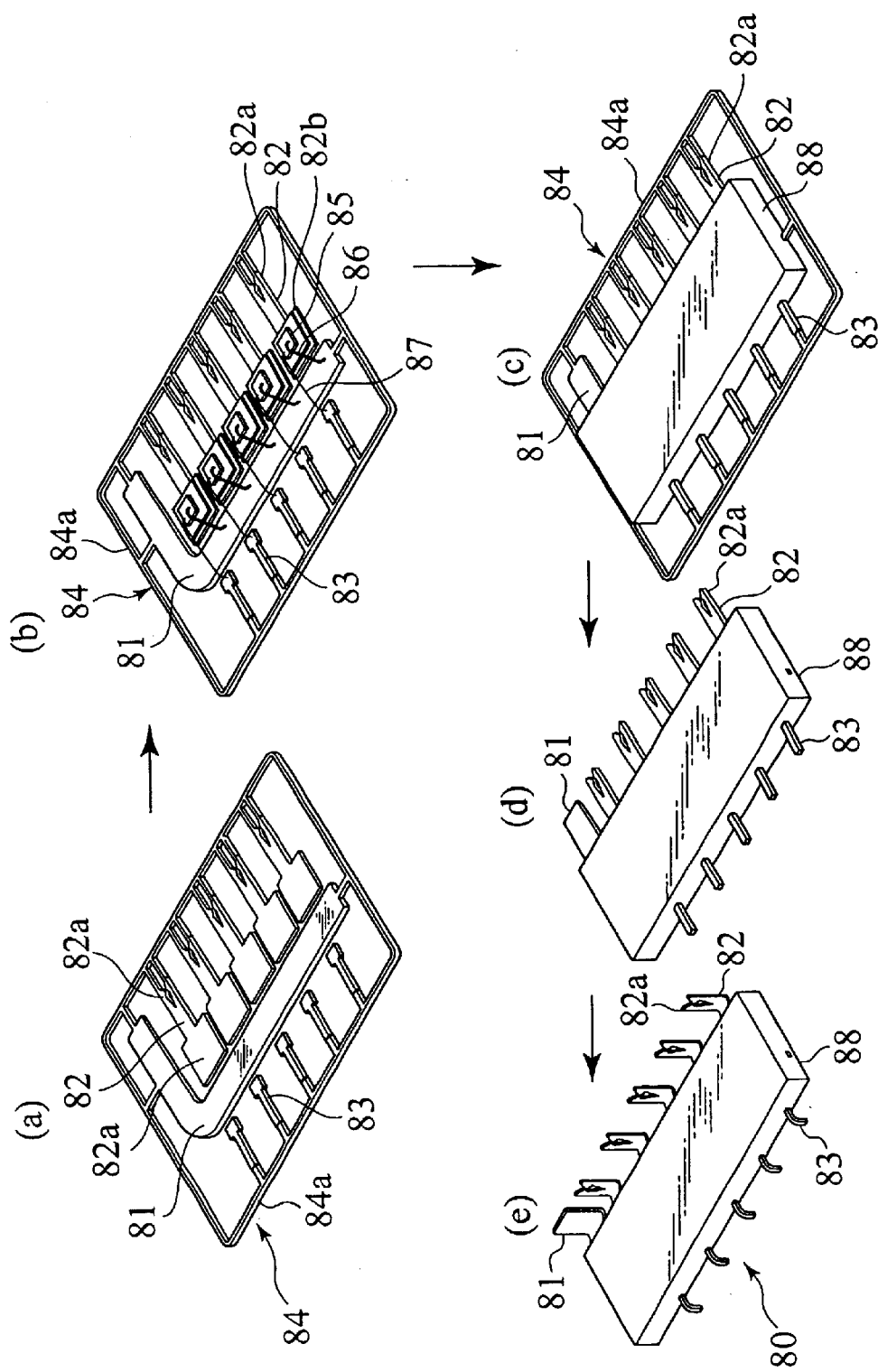
FIG. 7 is a process diagram showing the second example of the manufacturing order of the power-device module (a)–(e)
Figure 8:
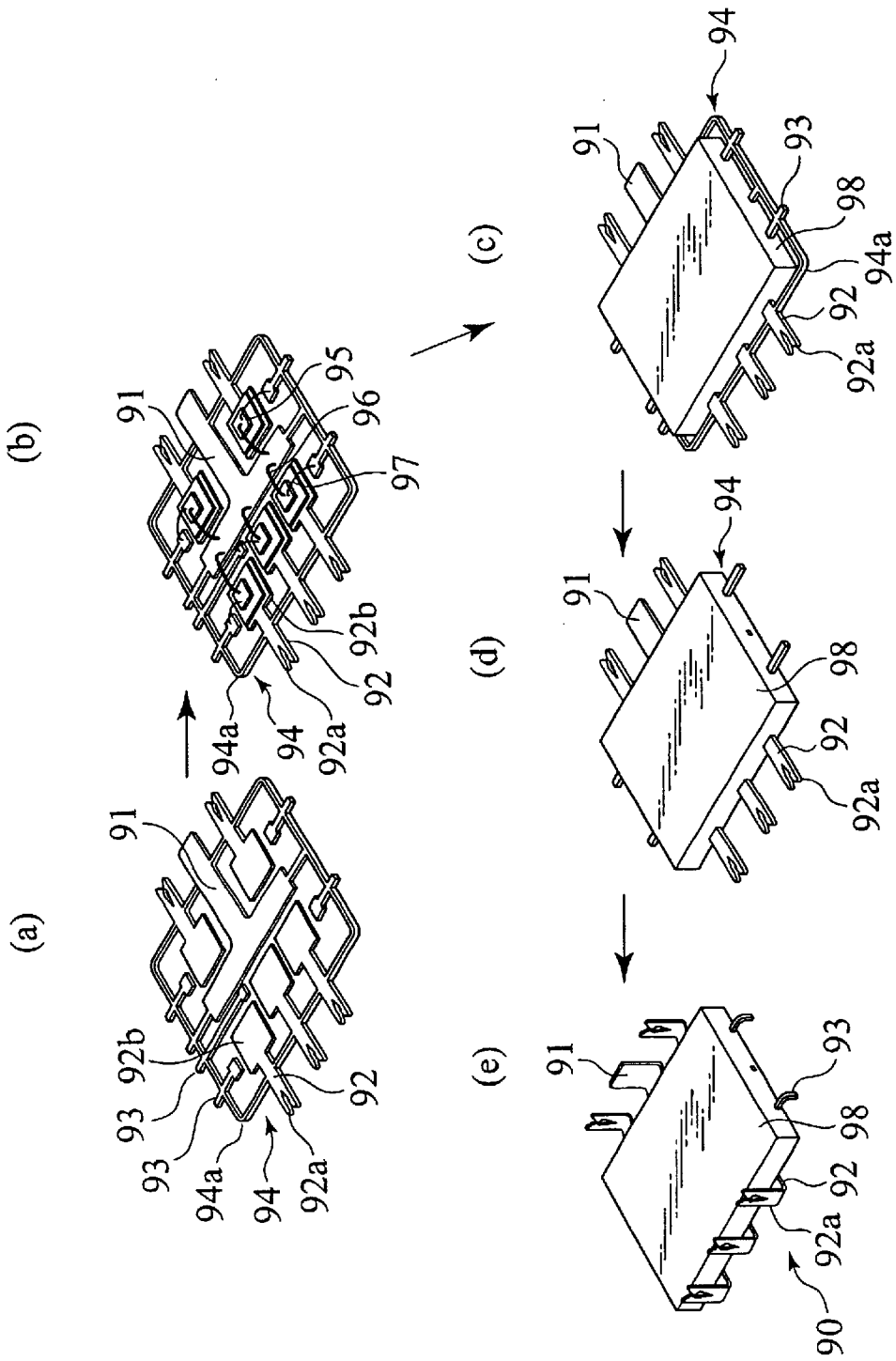
FIG. 8 is a process diagram showing the third example of the manufacturing order of the power-device module (a)–(e)

FIGS. 4A and 4B show the power-device module in accordance with the first embodiment. FIG. 4A is a perspective view of the power-device module before the resinous molding process. FIG. 4B is a perspective view of the power-device module after the resinous molding process. FIG. 5 is a perspective view showing a condition that the above power-device module is installed in the power distributing box.

The power-device module 60 includes a power-source side bus-bar 61 connected to a not-shown power source, a plurality of load side bus-bars 63 each provided, on its end, with a terminal 62 connected to an electrical load and shaped to be a tuning fork, a plurality of power devices 64 each interposed between the bus-bar 61 and the bus-bar 63 to perform the power-supply control for the electrical load, and a plurality of connecting terminals 65 connected to a built-in driver circuit for transmitting control signals to the power devices 64. These components are formed into one body by a resinous mold 66.

The power devices 64 are provided in the form of bare tips and bonded to the top face of the power-source side bus-bar 61. The connection between the power devices 64 and the load side bus-bars 63 and the connection between the power devices 64 and the connecting terminals 65 are accomplished by wire bondings 67, 68.

The power-source side bus-bar 61 is formed by a L-shaped metal plate consisting of a short piece part 61a and a long piece part 61b. Forming a connecting part for the power source, the short piece part 61a of the bus-bar 61 is provided with a bolt hole 61c. The power devices 64 in the form of bare tips are juxtaposed on an upper face of the long piece part 61b.

On the other hand, each of the load side bus-bars 63 is shaped to be a short plate. On one side of the long piece part 61b, these load side bus-bars 63 are juxtaposed to each extend in a direction perpendicular to the part 61b.

Each of the connecting terminals 65 is in the form of a pin. On the other side of the long piece part 61b, these connecting terminals 65 are also juxtaposed to each extend in a direction perpendicular to the part 61b. In order to allow of connection with the circuit baseplate, the connecting terminals 65 are arranged just like connector terminals. After being packed in the resinous mold 66, the connecting terminals 65 are processed so that their portions projecting from the mold 66 bend downward. In each load side bus-bar 63, the "tuning-fork" shaped terminal 62 is provided with a slit 62a into which the plate-shaped terminal 50a (FIG. 1) of the fuse 50 is to be inserted. After being packed in the resinous mold 66, these terminals 62 are processed so that their portions projecting from the mold 66 bend upward in the form of a letter "L". Consequently, the plate-shaped terminal 50a (FIG. 1) of the fuse 50 can be inserted into the "tuning-fork" type terminal 62 from the upside.

As to the formation of the power distributing box with the power device module 60, it is firstly installed on a circuit baseplate 55 accommodated in the casing body 3 and the connecting terminals 65 are soldered to circuit conductors (not shown) on the circuit baseplate 55, as shown in FIG. 5. Then, by inserting a bolt 69 into the bolt hole 61c (FIGS. 4A and 4B) of the bus-bar 61, the power device module 60 is fixed on the casing body 3 and simultaneously connected with a conductor 58 on the side of the power source. In this way, when the power device module 60 is settled at a designated position on the circuit baseplate 55 in the above way, pairs of terminals for connection with the fuses 50 (only one shown in FIG. 1) are formed by "tuning-fork" type terminals 57 provided in the casing body 3 in advance and the above "tuning-fork" type terminals 62 on the side of the power device module 60.

Owing to the above-mentioned structure of the power device module 60, if only mounting the module 60 on the circuit baseplate 55 as a constituent of the power distributing box and further connecting the connecting terminals 65 with the circuit conductors on the circuit baseplate 55, then it becomes possible to finish the power distributing box with ease.

Accordingly, since it is unnecessary to prepare connecting means (e.g. connectors, jumper wires) in order to establish the connection between the circuit board 55 and the power devices 64 and also the connection between the bus-bars 61, 53 and the circuit board 55, it is possible to reduce the number of components forming the power distributing box. Additionally, as the bus-bars 61, 63 and the power devices 64 both indispensable to the power distributing box are installed in the module 60, there is no need to provide superfluous bus-bars besides the module 60 and additionally, power lines wired in the circuit baseplate 55 are eliminated. Therefore, it is possible to reduce an occupation space necessary for the installation of components. Since the plural power devices 64 are in the form of bare tips and the individual power device 64 and the corresponding load side bus-bar 63 are gathered just like a single component, it is possible to reduce a space occupied by the components in comparison with a case that discrete components of the same number are arranged.

Further, since the power devices 64 of the plural number are built in the module 60, even if a current required by the electrical loads is large, the parallel using of the power devices 64 would enable the module 60 to ensure an effective current more than a rating of each power device 64. Therefore, the power distributing box quipped with the module 60 is capable of coping with even a situation where it is required to drive an electrical load whose working current is too large for the rating of a single power device 64. Additionally, since the module 60 is equipped with no element besides the power devices 64, the resultant power distributing box can drive any electrical load unless exceeding its load capacity.

Further, since the drive circuit for the power devices 64 is established on the circuit baseplate 5 outside the module 60, it is possible to modify the contents of control freely. For example, by establishing an optional rise time and an optional fall time, it would afford an optimum power control under any electrical load.

Noted that the power-source side bus-bar 61 is equipped, thereon, with the power devices 64 in the form of bare tips in the above-mentioned embodiment. In the modification, depending on the structure of a bare tip, the power devices 64 may be mounted on the load side bus-bars 63 respectively.

The sequential steps of manufacturing the power device module will be described with reference to three examples.

EXAMPLE 1ST. SHOWN IN FIG. 6

(a) Make a lead frame 74 where a power-source side bus-bar 71, load side bus-bars 72 and connecting terminals 73 are joined to each other through a bridge 74a while maintaining respective designated positions. Hereat, the straight power-source side bus-bar 71 is arranged in the center of the lead frame 74. On one side of the bus-bar 71, the load side bus-bars 72 are arranged so as to be perpendicular to the bus-bar 71 respectively. On the other side of the bus-bar 71, the connecting terminals 73 are arranged so as to be perpendicular to the bus-bar 71 respectively. Noted that the load side bus-bar 72 has a "tuning-fork" type terminal 72a formed on its outer end.

(b) Mount power devices 75 in the form of bare tips, on the power-source side bus-bar 71 to form a line, connect the power devices 75 with respective inner ends of the load side bus-bars 72 through wire bondings 76 respectively and connect the power devices 75 with respective inner ends of the connecting terminals 73 through wire bondings 77 respectively.

(c) Form a resinous mold 78 so as to cover the installation area of the power devices 75 and the connecting area of the wire bondings 76, 77.

(d) After molding, cut off the bridge 74a. As the bridge 74a is connected to each bus-bar 72 at its substantial center in the longitudinal direction and also connected to each connecting terminal 73 at its substantial center in the longitudinal direction as well, the bridge 74a is cut apart from both sides of each bus-bar 72 and also both sides of each terminal 73.

(e) Bend the connecting terminals (partial) 73 projecting from the resinous mold 78 downward and bend the bus-bars (partial) 72 projecting from the mild 78 upward, thereby completing a power device module 70 as a product.

EXAMPLE 2ND. SHOWN IN FIG. 7

(a) Make a lead frame 84 where a power-source side bus-bar 81, load side bus-bars 82 and connecting terminals 83 are joined to each other through a bridge 84a while maintaining respective designated positions. Hereat, the L-shaped power-source side bus-bar 81 is arranged in the center of the lead frame 84. On one side of a long piece part of the bus-bar 81, the load side bus-bars 82 are arranged so as to be perpendicular to the bus-bar 81 respectively. On the other side of the long piece part of the bus-bar 81, the connecting terminals 83 are arranged so as to be perpendicular to the bus-bar 81 respectively.

The bridge 84a has an annular part positioned outside of the power-source side" bus-bar 81, the load side bus-bars 82 and the connecting terminals 83. Extending from the annular part of the bridge 84a, respective branch parts are connected to the power-source side" bus-bar 81, the load side bus-bars 82 and the connecting terminals 83. The load side bus-bar 82 has a "tuning-fork" type terminal 82a formed on its outer end. Respective tips of the branch parts of the terminals 82a are joined to the tips of the branch parts of the bridge 84a.

In order to mount the power devices on the load side bus-bars 82 respectively, wide surface parts 82b are formed on respective inner ends of the bus-bars 82.

(b) Mount power devices 85 in the form of bare tips, on the wide surface parts 82b of the bus-bars 82 respectively, connect the power devices 85 with the power-source side bus-bars 81 through wire bondings 86 respectively and connect the power devices 75 with respective inner ends of the connecting terminals 83 through wire bondings 87 respectively.

(c) Form a resinous mold 88 so as to cover the installation area of the power devices 85 and the connecting area of the wire bondings 86, 87.

(d) After molding, cut off the bridge 84a at the tips of the branch parts.

(e) Bend the connecting terminals (partial) 83 projecting from the resinous mold 88 downward and bend the bus-bars (partial) 82 projecting from the mold 88 upward, thereby completing a power device module 80 as a product.

EXAMPLE 3RD. SHOWN IN FIG. 8

(a) Make a lead frame 94 where a power-source side bus-bar 91, load side bus-bars 92 and connecting terminals 93 are joined to each other through a bridge 94a while maintaining respective designated positions. Hereat, the T-shaped power-source side bus-bar 91 is arranged in the center of the lead frame 94. Around the power-source side bus-bar 91, there are arranged the load side bus-bars 92 and the connecting terminals 93 in appropriate order. The load side bus-bar 92 has a "tuning-fork" type terminal 92a formed on its outer end. In order to mount the power devices on the load side bus-bars 92 respectively, wide surface parts 92b are formed on respective inner ends of the bus-bars 82.

(b) Mount power devices 95 in the form of bare tips, on the wide surface parts 92b of the bus-bars 92 respectively, connect the power devices 95 with the power-source side bus-bars 91 through wire bondings 96 respectively and connect the power devices 95 with respective inner ends of the connecting terminals 93 through wire bondings 97 respectively.

(c) Form a resinous mold 98 so as to cover the installation area of the power devices 95 and the connecting area of the wire bondings 96, 97.

(d) After molding, cut off the bridge 94a at the tips of the branch parts.

(e) Bend the connecting terminals (partial) 93 projecting from the resinous mold 98 downward and bend the bus-bars (partial) 92 projecting from the mold 98 upward, thereby completing a power device module 90 as a product.

In the above-mentioned way, it is possible to produce the extremely-precise products (i.e. modules 70, 80, 90) with ease.

In common with the power device modules 60, 70, 80, 90 of the above-mentioned embodiments, an arraying pitch of the load side bus-bars 63, 73, 82, 92 is equal to an arraying pitch of the connecting terminals 65, 73, 83, 93.

Figure 9:
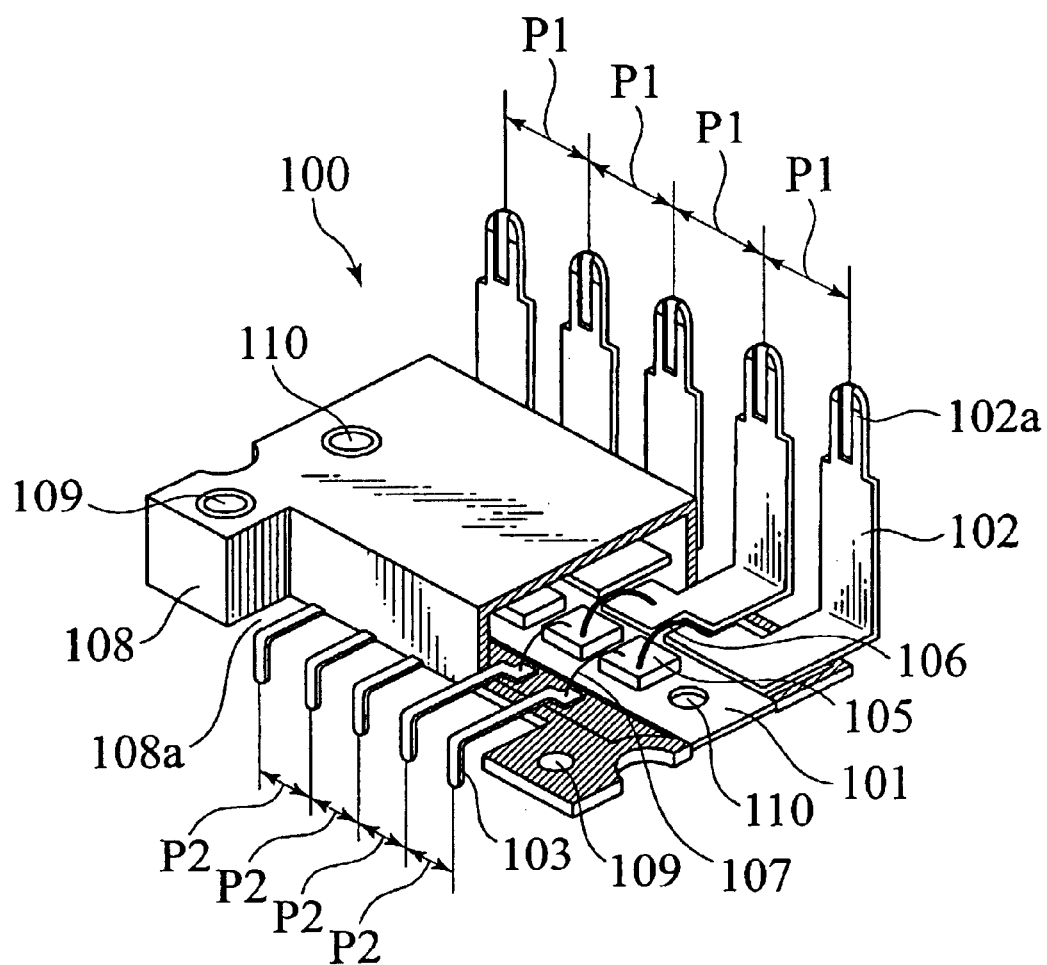
FIG. 9 is a partially-broken perspective view of the power-device module in accordance with another embodiment of the invention.
Figure 10A:
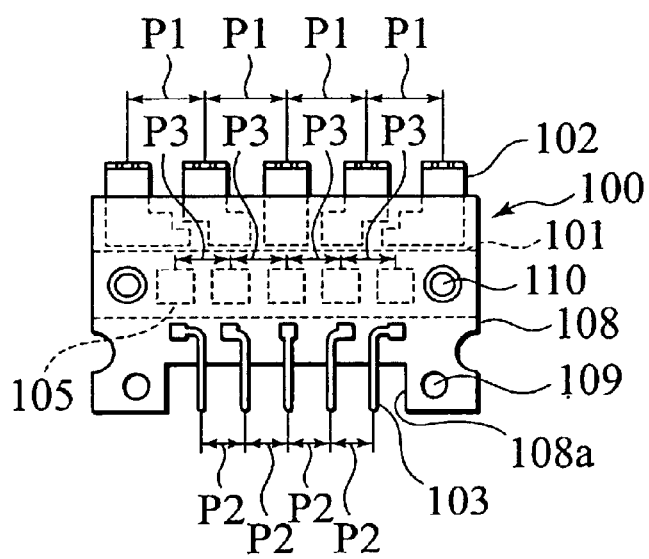
FIG. 10A is a plan view of the power-device module of FIG. 9.
Figure 10B:
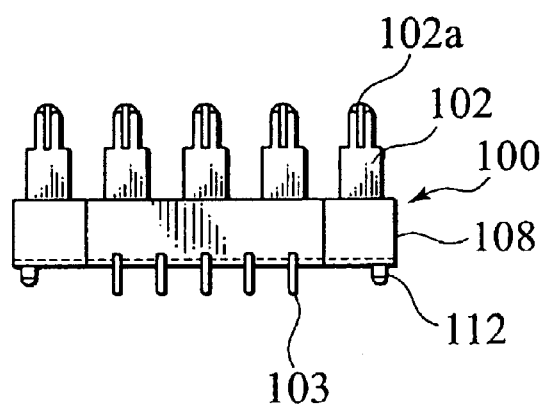
FIG. 10B is a front view of the power-device module of FIG. 9.
Figure 10C:
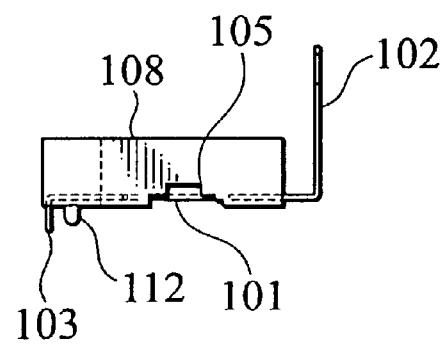
FIG. 10C is a side view of the power-device module of FIG. 9.
Figure 11:
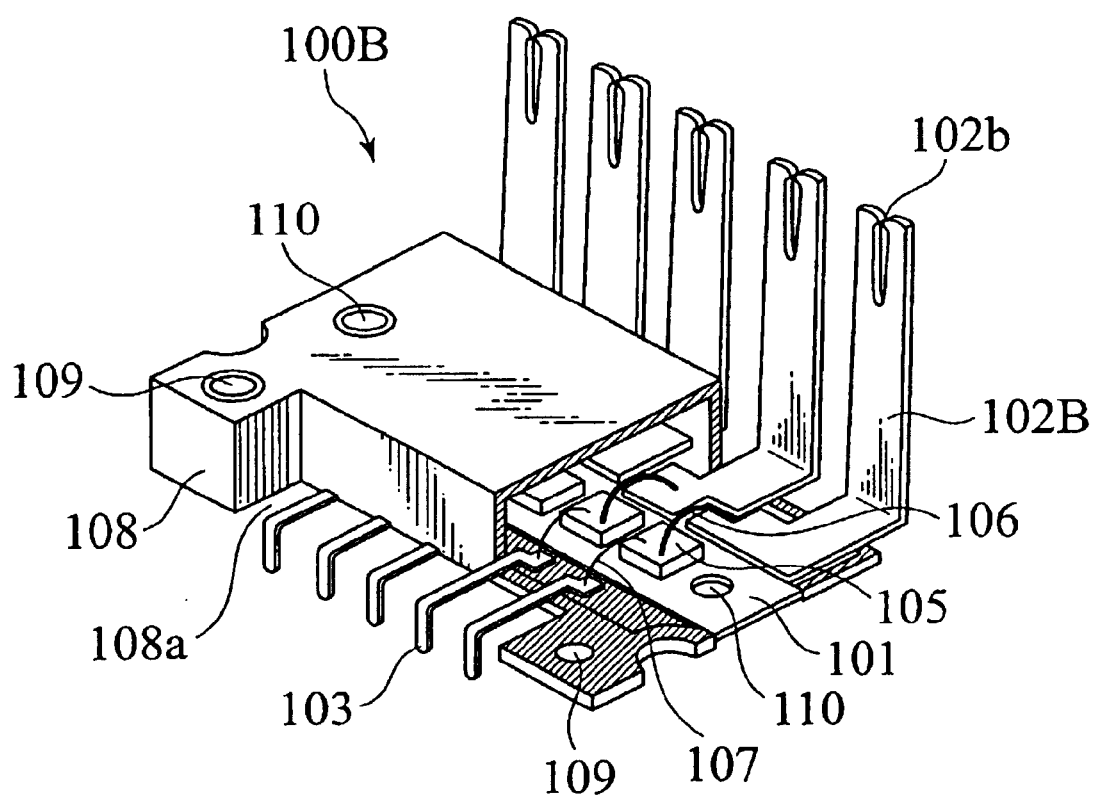
FIG. 11 is a partially-broken perspective view of the modification of the power-device module of FIG. 9.

To the contrary, FIGS. 9 to 11 show compact power device modules where the connecting terminals are arranged at a narrow pitch in comparison with the arraying pitch of the load side bus-bars.

The power device module 100 of FIGS. 9, 10A, 10B and 10C comprises a power-source side bus-bar 101, a plurality of load side bus-bars 102 arranged on one side of the bus-bar 101 at intervals of a first pitch P1 each and a plurality of connecting terminals 103 arranged on the other side of the bus-bar 101 at intervals of a second pitch P2 each. In detail, the second pitch P2 of the connecting terminals 103 is smaller than the first pitch P1 of the load side bus-bars 102. As a result, there are defined two free spaces on both sides of the array of the connecting terminals 103. Similarly to the previous embodiments, the power-source side bus-bar 101, the load side bus-bars (partial) 102 and the connecting terminals (partial) 103 are covered with a resinous mold 108. The resinous mold 108 is provided, at its resinous portions corresponding to the above free spaces, with "screw" attaching parts (i.e. through-holes) 109 for attaching the module 100 to a not-shown circuit baseplate.

In this assembly, power devices 105 in the form of bare tips are arranged on the power-source side bus-bar 101. Corresponding to the connecting terminals 103 arranged at intervals of the second pitch P2, the power devices 105 are arranged at intervals of a third pitch P3 narrower than the first pitch P1, as well.

In detail, the third pitch P3 of the power devices 105 is smaller than the first pitch P1 of the load side bus-bars 102. As a result, there are defined two free spaces on both sides of the array of the power devices 105. In these free spaces, connecting parts (i.e. holes) 110 are ensured to connect the power-source side bus-bar 101 with an external element (not shown).

Noted that respective legs of the connecting terminals 103 project outward as if they were hidden by a recess 108a on the lateral side of the resinous mold 108. The above attaching parts 109 are positioned in resinous projecting parts on both sides of the recess 108a. Further, the resinous mold 108 is provided, on its bottom face, with projections 112 for positioning the module 100.

In this way, since the attaching parts 109 and the connecting parts 110 are provided in the spaces as a result of narrowing the second pitch P2 of the connecting terminals 103 and the third pitch P3 of the power devices 105 in comparison with the first pitch P1 of the load side bus-bars 102, it is possible to arrange the attaching parts 109 in respective positions inside the power device module 100. Additionally, it is possible to arrange the power-source side bus-bar 101 without projecting from the power device module 100 outward. Therefore, it is possible to provide the small-sized power device module 100.

Noted that, in the above-mentioned power device module 100, each of the load side bus-bars 102 has a leading terminal 102 in the form of a F-F terminal. In the modification of the embodiment, FIG. 11 shows another power device module 100B. The power device module 100B differs from the power device module 100 in the provision of a plurality of load side bus-bars 102B each having a "tuning-fork" type terminal 102b as similar to the first embodiment. With the formation of the load side bus-bar 102B, the power device module 100B allows the terminal 50a (FIG. 1) of the fuse 50 to be inserted into the "tuning-fork" type terminal 102b directly.

The scope of the invention is defined with reference to the following claims.

What is claimed is:

1. A power distributing box electrically interposed between a power source and respective electrical loads, the power distributing box comprising:

a casing;

a power-source side bus-bar accommodated in the casing and connected to the power source;

a plurality of load side bus-bars accommodated in the casing, the load side bus-bars having respective terminals connected to the electrical loads respectively;

a plurality of power devices accommodated in the casing and respectively interposed between the power-source side bus-bar and the load side bus-bars to control power supply for the electrical loads; and a circuit baseplate accommodated in the casing to have a built-in driver circuit for transmitting control signals to the power devices;

wherein the power devices in the form of bare tips are arranged on and connected to either one of the power-source side bus-bar and the load side bus-bars; and the power devices are connected to the circuit baseplate and the other one of the power-source side bus-bar and the load side bus-bars, through wire bondings.

2. The power distributing box as claimed in claim 1, wherein each of the terminals of the load side bus-bars is shaped so as to be a tuning fork having a slit allowing an insertion of a plate-shaped terminal of a fuse.

3. The power distributing box as claimed in claim 1, wherein an installation area of the power devices and a connecting area of the wire bondings are covered with a resinous mold.

4. The power distributing box as claimed in claim 1, further comprising a radiator plate for mounting the power-source side bus-bar and the load side bus-bars thereon, wherein the radiator plate having the power-source side bus-bar and the load side bus-bars thereon is accommodated in the casing.

5. A power device module to be electrically interposed between a power source and respective electrical loads, the power device module comprising:

a power-source side bus-bar connected to the power source;

a plurality of load side bus-bars having respective terminals connected to the electrical loads respectively;

a plurality of power devices respectively interposed between the power-source side bus-bar and the load side bus-bars to control power supply for the electrical loads;

a plurality of connecting terminals connected to the power devices, for transmitting control signals to the power devices; and a resinous mold for covering the power-source side bus-bar, the load side bus-bars, the power devices and the connecting terminals, in integration;

wherein the power devices in the form of bare tips are arranged on and connected to either one of the power-source side bus-bar and the load side bus-bars; and the power devices are connected to the connecting terminals and the other one of the power-source side bus-bar and the load side bus-bars, through wire bondings.

6. The power device module as claimed in claim 5, wherein the load side bus-bars are arranged on one side of the power-source side bus-bar at intervals of a first pitch each;

the connecting terminals are arranged on the other side of the power-source side bus-bar at intervals of a second pitch each, the second pitch being smaller than the first pitch thereby defining at least one free space at the end of the array of the connecting terminals; and the power device module has an attaching part established in the free space, for attachment of the power device module.

7. The power device module as claimed in claim 5, wherein the load side bus-bars are arranged on one side of the power-source side bus-bar at intervals of a first pitch each;

the power device in the form of bare tips are arranged on the power-source side bus-bar at intervals of a third pitch each, the third pitch being smaller than the first pitch thereby defining at least one free space at the end of the array of the power devices; and the power device module has a connecting part established in the free space, for external connection of the power-source side bus-bar.

8. The power device module as claimed in claim 5, wherein each of the terminals of the load side bus-bars is shaped so as to be a tuning fork having a slit allowing an insertion of a plate-shaped terminal of a fuse.

* * * * *

UNITED STATES PATENT AND TRADEMARK OFFICE
CERTIFICATE OF CORRECTION

PATENT NO. : 6,707,369 B2  Page 1 of 1
DATED : March 16, 2004
INVENTOR(S) : Mitsuaki Morimoto and Yoshinori Ikuta It is certified that error appears in the above-identified patent and that said Letters Patent is hereby corrected as shown below:

<u>Title page,</u>
Item [57], ABSTRACT,
Line 7, "base plate" should read -- baseplate --.

Signed and Sealed this

Twelfth Day of April, 2005

JON W. DUDAS
*Director of the United States Patent and Trademark Office*